US007675778B2

(12) United States Patent  
Aritome

(10) Patent No.: US 7,675,778 B2  
(45) Date of Patent: Mar. 9, 2010

(54) MEMORY DEVICES HAVING REDUCED WORD LINE CURRENT AND METHOD OF OPERATING AND MANUFACTURING THE SAME

(75) Inventor: Seiichi Aritome, Zhudong Town (TW)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 11/951,166

(22) Filed: Dec. 5, 2007

(65) Prior Publication Data

US 2009/0147588 A1   Jun. 11, 2009

(51) Int. Cl.
 *G11C 16/04* (2006.01)
(52) U.S. Cl. .................... 365/185.17; 365/185.18; 365/148; 365/185.29
(58) Field of Classification Search ............ 365/185.17, 365/185.28, 185.23, 185.33, 185.27
See application file for complete search history.

(56) References Cited

U.S. PATENT DOCUMENTS

| 5,526,315 | A | * | 6/1996 | Kaya et al. | 365/185.18 |
| 5,579,262 | A | * | 11/1996 | Song | 365/185.22 |
| 6,370,062 | B2 | * | 4/2002 | Choi | 365/185.23 |
| 6,594,178 | B2 | * | 7/2003 | Choi et al. | 365/185.17 |
| 6,819,590 | B2 | * | 11/2004 | Goda et al. | 365/185.03 |
| 2006/0256622 | A1 | | 11/2006 | Aritome | |
| 2006/0262606 | A1 | | 11/2006 | Aritome | |
| 2006/0262607 | A1 | | 11/2006 | Aritome | |
| 2007/0030737 | A1 | | 2/2007 | Aritome | |

\* cited by examiner

*Primary Examiner*—David Lam  
(74) *Attorney, Agent, or Firm*—Fletcher Yoder

(57) ABSTRACT

There is provided a memory array and methods for manufacturing the same. In one embodiment, there is provided a string comprising a plurality of transistors. Each of the plurality of transistors includes: a charge storage node, a control gate, and at least one resistive element coupled to the string. The control gate of at least one of the plurality of transistors can be selectively coupled to a reference potential via a corresponding one of the at least one resistive element.

27 Claims, 6 Drawing Sheets

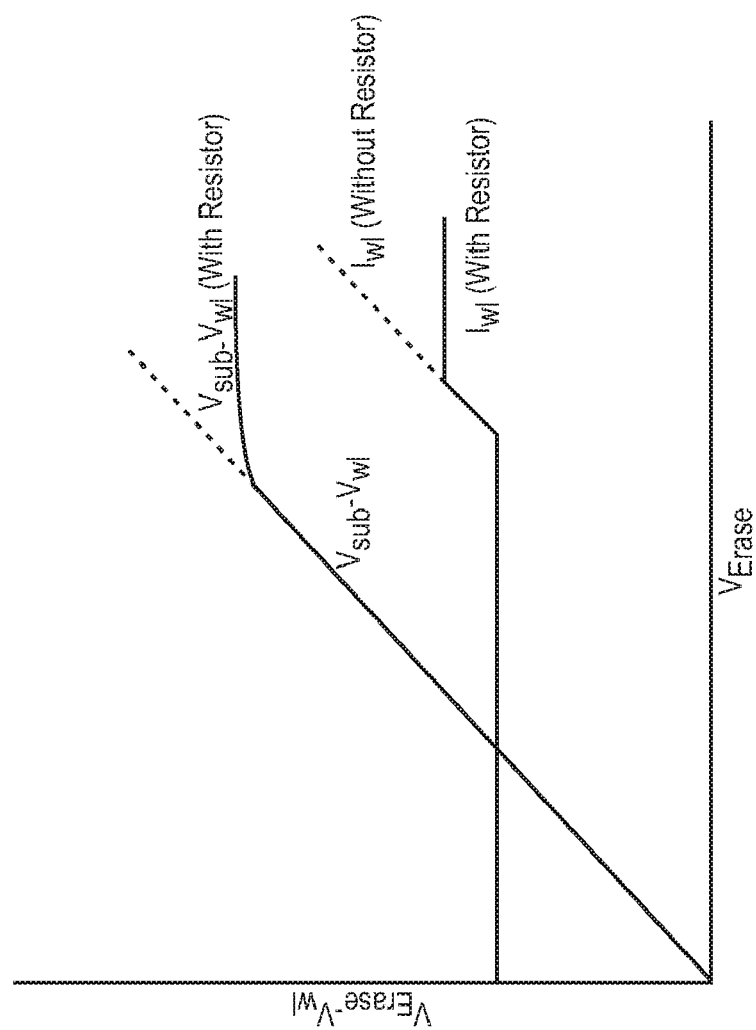

MEMORY DEVICES HAVING REDUCED WORD LINE CURRENT AND METHOD OF OPERATING AND MANUFACTURING THE SAME

BACKGROUND

1. Field of the Invention

Embodiments of the present invention relate generally to memory devices and more specifically, in one or more embodiments, to non-volatile memory devices.

2. Description of the Related Art

Processor-based systems, such as computers, typically include one or more memory devices to provide storage capability for the system. Generally, system memory is provided in the form of one or more memory devices and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. One common type of read-only memory is electrically-erasable read only memory (EEPROM) in which an electrical charge may be used to program and/or erase data in the memory. Although EEPROM can be erased and re-programmed multiple times, they are still described as "read-only memory" as, generally speaking, the reprogramming process is generally infrequent, comparatively slow, and often does not permit random access writes to individual memory locations (which are possible when reading a ROM).

Flash memory is a type of EEPROM that can be erased and reprogrammed in blocks. Flash memory is often employed in personal computer systems in order to store the Basic Input Output System (BIOS) program such that it can be easily updated. Flash memory is also employed in wireless electronic devices, because it enables the manufacturer to support new communication protocols as they become standardized and provides the ability to remotely upgrade the devices for enhanced features.

A typical flash memory includes a memory array having a large number of memory cells arranged in rows and columns. The memory cells are generally grouped into blocks such that groups of cells can be programmed or erased simultaneously. Each of the memory cells usually includes a floating-gate field-effect transistor capable of holding a charge, although other charge storage nodes could be used, such as charge traps such as SONOS devices. Floating gate memory cells differ from standard MOSFET designs in that they include an electrically isolated gate, referred to as the "floating gate," in addition to the standard control gate. The floating gate is generally formed over the channel and separated from the channel by a dielectric (e.g., oxide) layer. The control gate is formed directly above the floating gate and is separated from the floating gate by another dielectric (e.g., oxide) layer. A floating gate memory cell stores information by holding electrical charge within the floating gate. By adding or removing charge from the floating gate, the threshold voltage of the cell changes, thereby defining whether this memory cell is programmed or erased.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a select line, which is often referred to as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a transfer line, which is commonly referred to as a bit line.

The memory array is accessed by a row decoder activating a row of memory cells by selecting the word-select line connected to a control gate of a memory cell. In addition, the word-select lines connected to the control gates of unselected memory cells of each string are driven to operate the unselected memory cells of each string as pass transistors, so that they pass current in a manner that is unrestricted by their stored data values. Current then flows from the source line to the bit line through each NAND string via the corresponding select gates, restricted only by the selected memory cells of each string. This places the current-encoded data values of the row of selected memory cells on the bit lines.

In scaling NAND flash memory with today's ever-decreasing device geometries, the dielectric layers of the memory cells are becoming increasingly thinner. Additionally, the thinner dielectric oxide layers help to reduce the voltage level(s) associated with program and erase the cells. However, because the dielectric layers have a reduced thickness, current between the control gate and the substrate may be introduced during the program and erase operations. The current may be especially prevalent in memory cells adjacent to the source select gates and the drain select gates during an erase operation and is induced because of the high electrical field when an erase voltage is applied to the substrate and the low gate coupling ratio of the dielectric layer between the control gate and the floating gate.

Embodiments of the present invention may be directed to one or more of the problems set forth above.

BRIEF DESCRIPTION OF THE DRAWINGS

FIG. 6 is a graph illustrating the current in the word line, an erase voltage and a word line voltage as a function of the erase voltage in accordance with an embodiment of the present invention.

DETAILED DESCRIPTION

Figure 1:
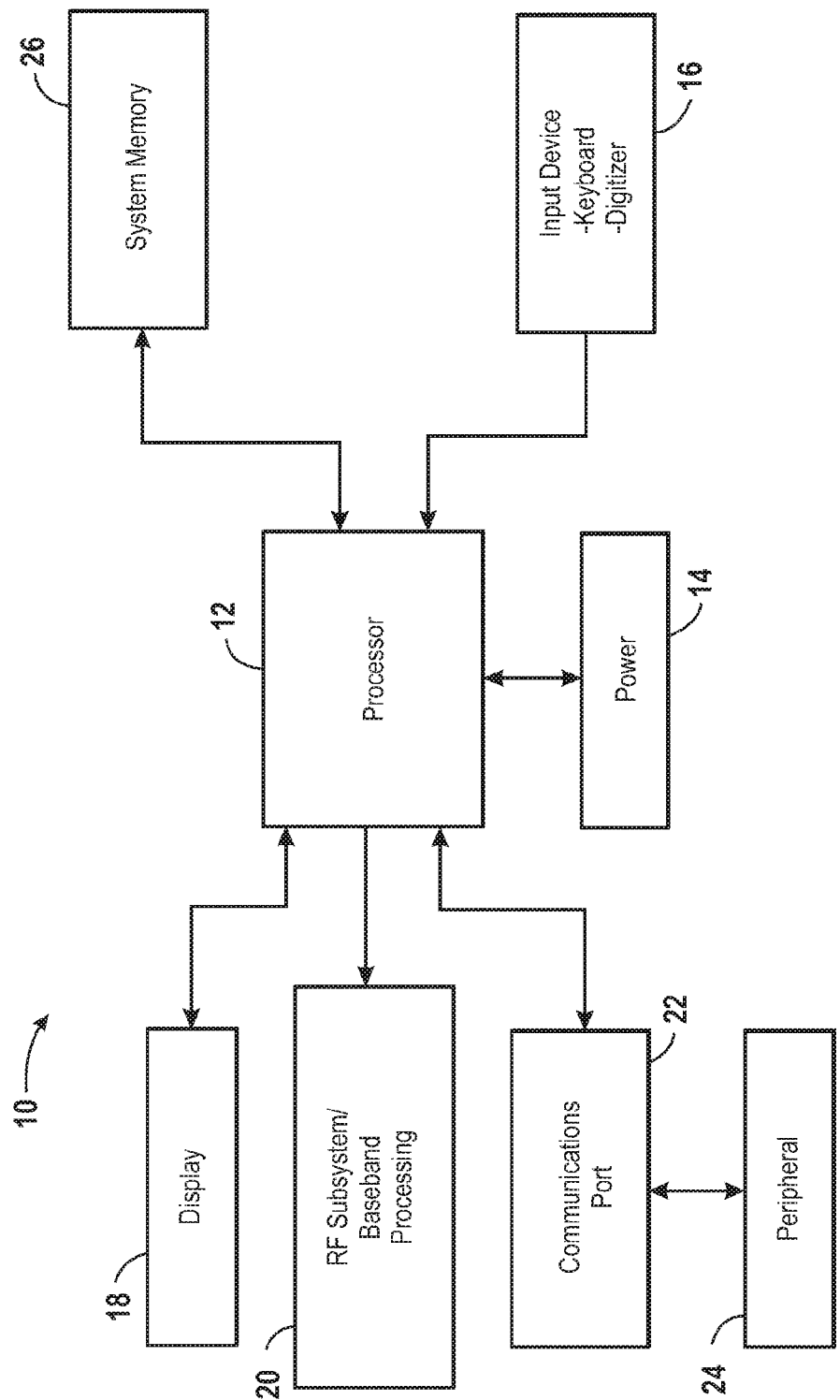
FIG. 1 illustrates a block diagram of a processor-based device having a memory that includes memory devices fabricated in accordance with embodiments of the present invention.

Turning to the drawings, and referring initially to FIG. 1, a block diagram illustrating a processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

The processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. The memory is coupled to the processor 12 to store and facilitate execution of various programs. As described further below, the system memory 26 may include one or more memory devices, such as flash memory devices, that may include a floating gate memory array fabricated in accordance with embodiments of the present invention.

Figure 2:
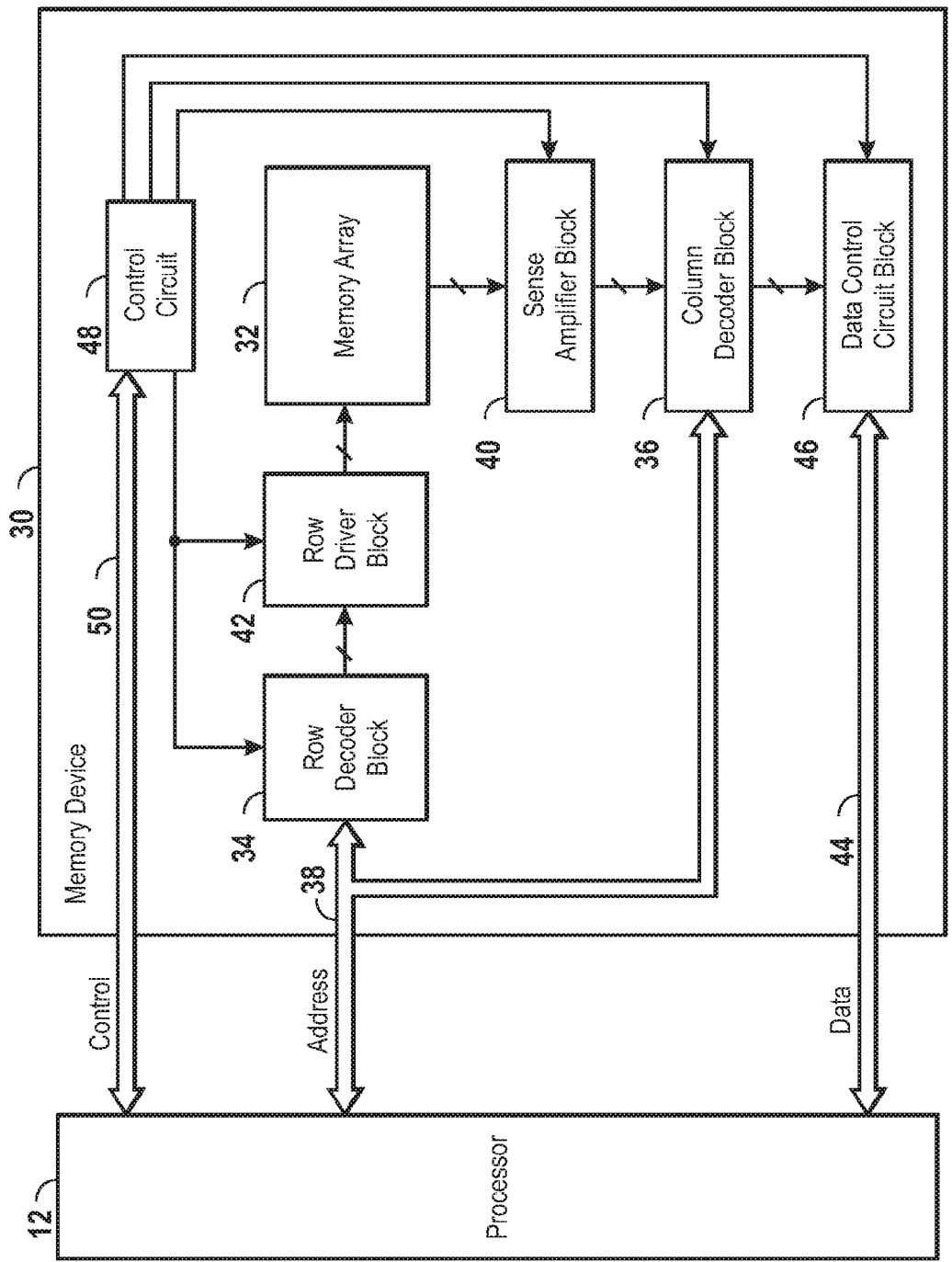
FIG. 2 illustrates a block diagram of a memory device having a memory array fabricated in accordance with embodiments of the present invention.

A block diagram illustrating a flash memory device 30 that may be included as a portion of the system memory 26 of FIG. 1 is illustrated in FIG. 2. As will be described further below with respect to FIG. 3, the flash memory device 30 may be a NAND flash memory device. The flash memory device 30 includes a memory array 32. The memory array 32 generally includes many rows and columns of conductive traces arranged in a grid pattern to form a number of memory cells. The select lines are often viewed as rows or "row lines" that make up the memory array 32 and are generally referred to as "word lines." The transfer lines are often viewed as columns or "column lines", and are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of the sense amplifies is also provided between the column decoder 36 and the memory array 32 to sense and amplify individual values stored in the memory cells. Further, a row driver block 42 is provided between the row decoder block 34 and the memory array 32 to activate selected word lines in the memory array according to a given row address.

During read and write operations, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is configured to coordinate timing and control among the various circuits in the flash memory device 30.

Figure 3:
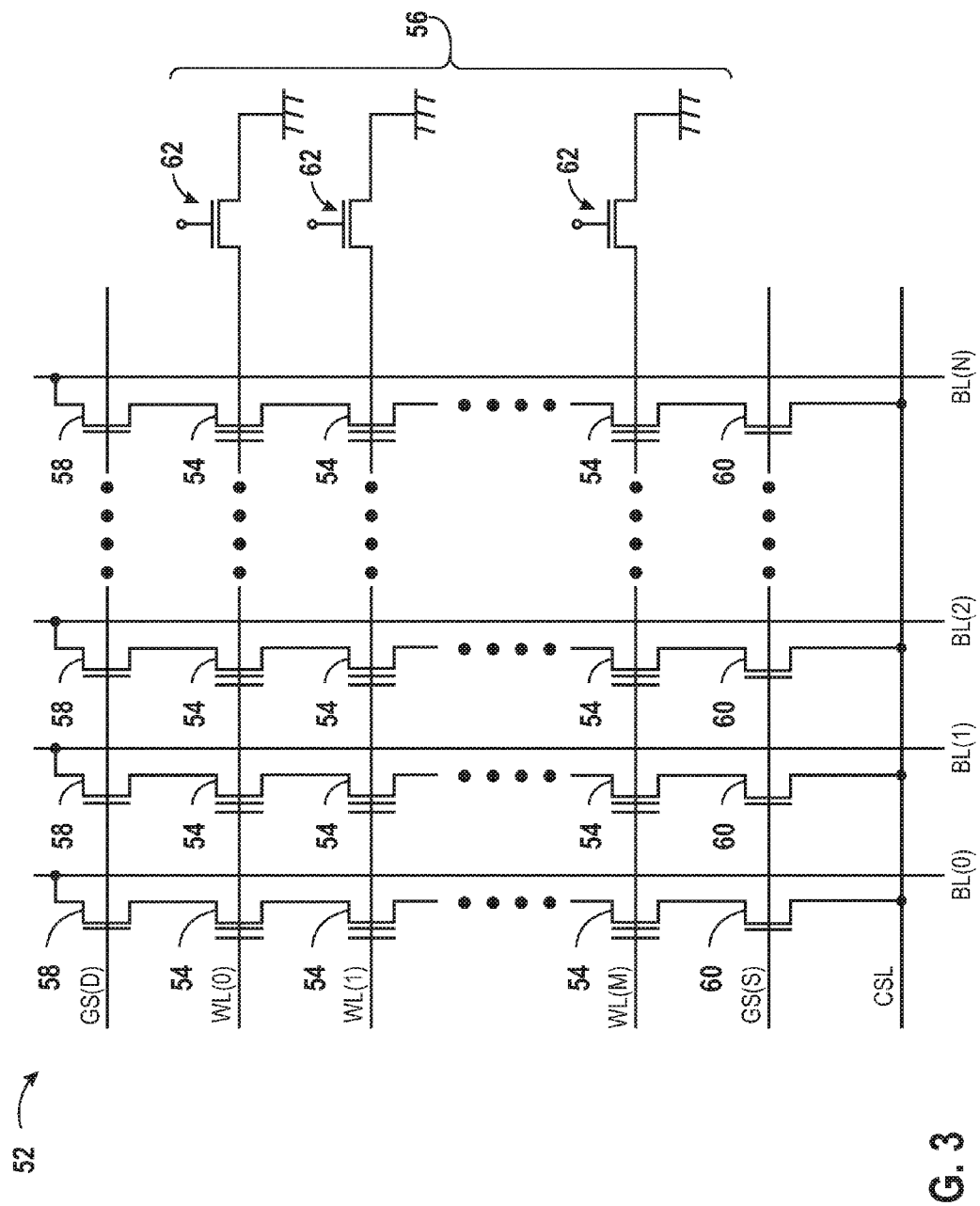
FIG. 3 is schematic diagram of a NAND flash memory array in accordance with embodiments of the present invention.

FIG. 3 illustrates an embodiment of the memory array 32 of FIG. 2 in accordance with embodiments of the present invention. In the present embodiment, the memory array 32 comprises a NAND memory array 52. The NAND memory array 52 includes word lines WL(0)-WL(M) and intersecting local bit lines BL(0)-BL(M). As will be appreciated, for ease of addressing in the digital environment, the number of word lines WL and the number of bit lines BL are each a power of two (e.g., 256 word lines WL by 4,096 bit lines BL). The local bit lines BL are coupled to global bit lines (not shown) in a many-to-one relationship.

The NAND memory array 52 includes a floating gate transistor 54 located at each intersection of a word line WL and a local bit line BL. The floating gate transistors 54 serve as non-volatile memory cells for storage of data in the NAND memory array 52, as previously described. As will be appreciated, each floating gate transistor 54 includes a source, a drain, a floating gate, and a control gate. The control gate of each floating gate transistor 54 is coupled to a respective word line WL. Each of the word lines WL(0)-WL(M) is coupled to a driver transistor 62. The driver transistor 62 may be a high voltage transistor capable of operating in the 25 to 30 volt range and may be configured to couple the word lines WL to a reference potential (e.g., ground) during an erase operation.

The floating gate transistors 54 are connected in series, source to drain, to form a NAND string 56 formed between gate select lines. Specifically, the NAND strings 56 are formed between the drain select line GS(D) and the source select line GS(S). The drain select line GS(D) is coupled to each NAND string 56 through a respective drain select gate 58. Similarly, the source select line GS(S) is coupled to each NAND string 56 through a respective source select gate 60. The drain select gates 58 and the source select gates 60 may each comprise a field-effect transistor (FET), for instance. A column of the memory array 52 includes a NAND string 56 and the source select gate 60 and drain select gate 58 connected thereto. A row of the floating gate transistors 52 are those transistors commonly coupled to a given word line WL.

The source of each source select gate 60 is connected to a common source line CSL. The drain of each source select gate is coupled to the source of a floating gate transistor 54 in a respective NAND string 56. The gate of each source select gate 60 is coupled to the source select line GS(S).

The drain of each drain select gate 58 is connected to a respective local bit line BL for the corresponding NAND string 56. The source of each drain select gate 58 is connected to the drain of a floating gate transistor 54 of a respective NAND string 56. Accordingly, as illustrated in FIG. 3, each NAND string 56 is coupled between a respective drain select gate 58 and source select gate 60. The gate of each drain select gate 58 is coupled to the drain select line GS(D).

Figure 4:
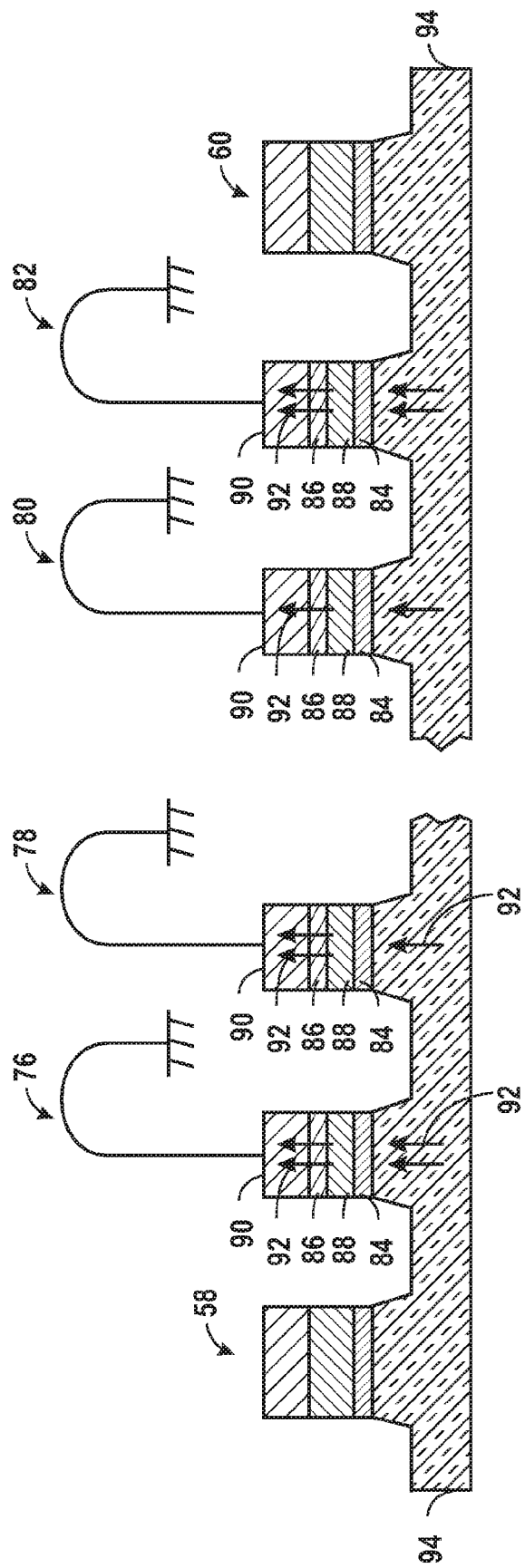
FIG. 4. is a cross-sectional view of a NAND string in accordance with embodiments of the present invention.

A cross-sectional illustration of the NAND string 56 of the NAND array 52 is illustrated in FIG. 4. The NAND string 56 includes the drain and source select gates 58 and 60, respectively, which are coupled to the source select line GS(S) and the drain select line GS(D). The NAND string 56 also includes a plurality of floating gate transistors, four of which are shown as floating gate transistors 76, 78, 80 and 82. The floating gate transistors 76, 78, 80 and 82 are connected together in series, source to drain, between the drain and source select gates 58 and 60 to form the NAND string 56, as previously described. The floating gate transistors 76, 78, 80 and 82 each include two dielectric layers, a tunnel dielectric layer 84 of silicon dioxide, for example, and an inter-gate dielectric layer 86, such as an oxide nitridized oxide layer (ONO). The tunnel layer 84 provides electrical isolation between the substrate 94, which may be made of silicon and a floating gate 88, which may be made of polysilicon. The inter-gate dielectric layer 86 is located between the floating gate 88 and a control gate 90. The control gate 90 of each floating gate transistor 76, 78, 80 and 82 is coupled to its corresponding word line WL(0)-WL(M), as explained above. Generally, the floating gate memory cells are programmed by applying a high voltage across the control gate 90 to tunnel carriers (electrons) into the electrically isolated floating gate of the memory cells. A floating gate in an erased state, lacking carriers in the floating gate, typically signifies a logical "1", while a programmed cell with carriers in the floating gate typically signifies a logical "0". Other embodiments may utilize various levels of carriers to provide various programmed states, such as to provide a multi-level cell, for example.

During the high performance program and erase operations, a high electric field is applied to the inter-gate dielectric layer 86 of the memory cell. A common programming technique for floating gate memories includes applying a voltage, such as 18V, for example, to the control gates 90 of the memory cells via the word lines WL(0)-WL(M) while simultaneously supplying either a programming voltage of 0V or an inhibit voltage of 4.5V to the bit lines connected with the memory cells. During the programming operation, the programmed cells receive an injection of charge to the floating gate to become a logical "0" and the memory cells that are not programmed remain at a logical "1". During an erase operation, an erase voltage between 16 volts and 25 volts, such as 20V, for example, is applied to the substrate of the memory cells while the control gates of the memory cells are coupled to ground via the driver transistor 62 (FIG. 3). This effectively removes charge stored in the floating gate and, thus, erases the memory cells (setting the memory cells to a logical "1"). It is recognized that alternative techniques for programming and erasing floating gate cells may be known in the art, and that the above techniques are given only as illustrations of each operation.

The application of the high electric field to the memory cells during the program and erase operations may cause undue stress on the memory cells. Specifically, the stress is a result of a differential between the voltage in the control gate 90 ($V_{wl}$) and the voltage of the substrate ($V_{substrate}$). Because of the differential, during an erase operation, a current (illustrated by arrows 92 in FIG. 4) which flows from the substrate through the control gate 90 may be induced.

As discussed previously, the dielectric layers 84 and 86 may be made thinner to reduce the amount of voltage required to program and erase the floating gate transistors. However, the thinner dielectric layers may alter the coupling ratios and allow for the current 92 to be induced. In particular, the thinner dielectric layers result in a lower coupling ratio between the floating gate 88 and the control gate 90 and a higher coupling ratio between the floating gate 88 and the substrate 94. The current 92 induced during a high performance erase may be particularly prevalent in the edge word lines (WL(0) and WL(M)), the word lines adjacent to the drain select gate 58 and source select gate 60. The through current increases the stress on the memory cell because a Fowler-Nordheim current through the tunnel dielectric layer 84 and the carrier trap in inter-gate dielectric layer 86 is increased. The stress caused by the current 92 may lead to premature failure and the reduced reliability.

Figure 5:
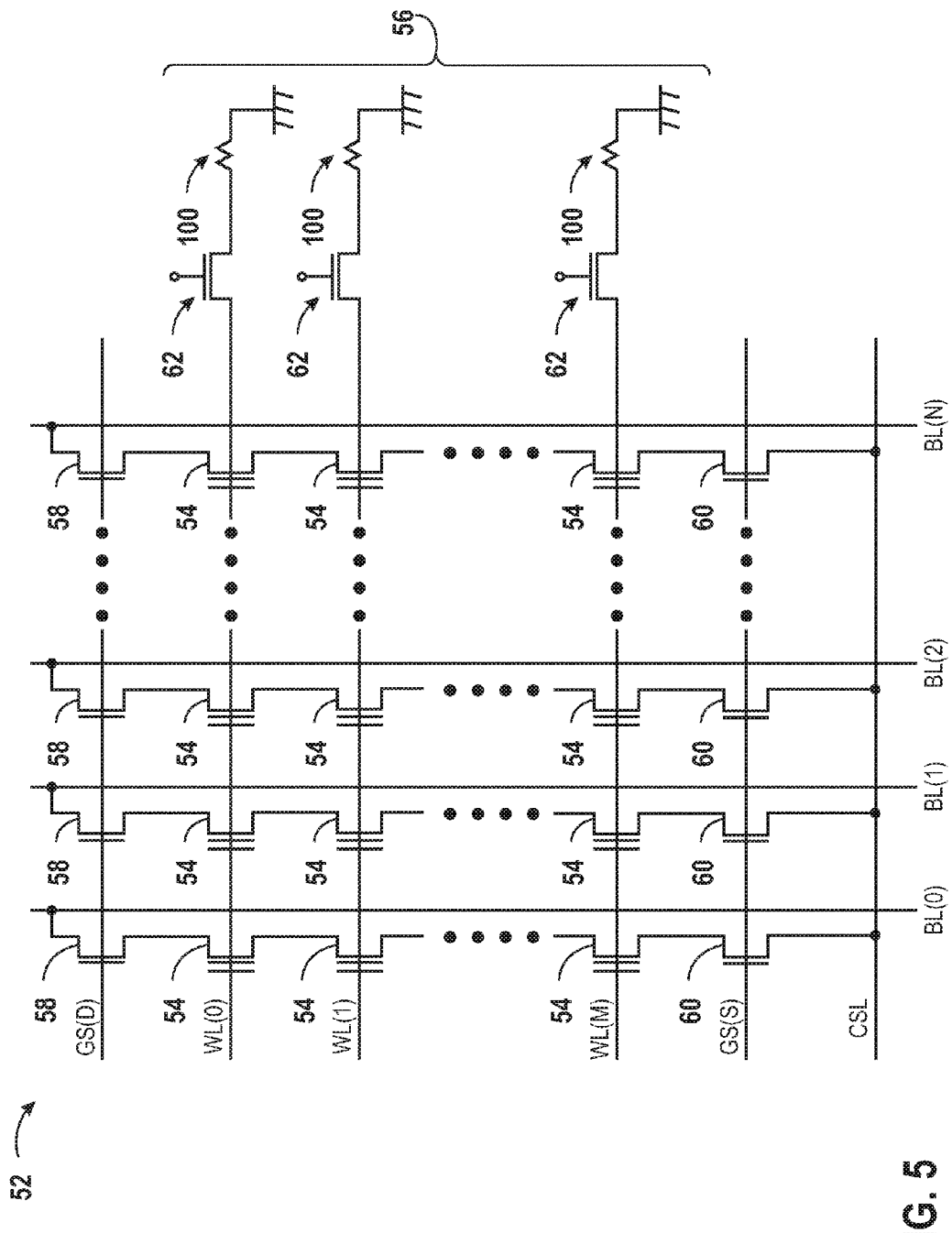
FIG. 5. is a schematic diagram of a NAND flash memory having a resistor coupled to the ground connected pass of the word line in accordance with an embodiment of the present invention.

In order to reduce and/or prevent the stress and excess current through the word line WL during high performance program and erase operations, a resistance, such as resistor 100, may be added on the ground connected pass of the word line WL, as illustrated in FIG. 5. The voltage drop across the resistor 100 during instances of excess current allows the difference between the word line voltage ($V_{WL}$) and the substrate voltage ($V_{substrate}$) to become saturated, thus reducing the stress on the memory cell and mitigating the degradation of the cell. The resistor 100 may have any value based on the particular configuration of the memory array, as discussed below. For example in a particular embodiment, the resistor 100 may be between 100 kilo Ohms and 100 Giga Ohms.

As described earlier, during an erase event the voltage applied to the substrate may be 20 volts, for example, while the control gate, via the word line WL, is coupled to a reference potential, such as ground. FIG. 6 illustrates a graph of the stress voltage ($V_{substrate}-V_{wl}$) as a function of the $V_{substrate}$. As the $V_{substrate}$ increases (moving horizontally from left to right across the chart), the difference between the $V_{substrate}$ and the $V_{wl}$ increases. At a certain point, a threshold for breakdown of the dielectric layers is crossed and current $I_{WL}$ begins to flow from the substrate 94 through the control gate 90. The precise voltage level of the threshold may vary according to the particular physical characteristics of the floating gate transistor and, as previously stated, the edge transistors 76 and 82 of the edge word lines WL(O) and WL(M) experience the current to a greater extent when compared to the other transistors in a NAND string 56.

The voltage drop across the resistor 100 allows for the stress voltage ($V_{substrate}-V_{wl}$) during an erase operation to be saturated and the degradation of the memory cell (the tunnel layer 84, in particular) can be mitigated. At the saturation voltage, the amount of current cannot be increased by increasing the voltage. This is because the number of electrons entering into the control gate 90 is equal to the number of electrons leaving the control gate 90. As illustrated in FIG. 6, the stress voltage ($V_{substrate}-V_{WL}$) levels off at what may be termed the saturation voltage. Thus, by adding the resistor 100 and saturating the stress voltage, the through current and the stress voltage can be limited.

The resistance of the resistor 100 may be determined based on the amount of through current that is occurring in the particular word line WL. For example, if the amount of through current is approximately 1 microampere ($\mu A$), a resistor having a value of 1 Mega Ohm (M$\Omega$) may be selected. According to Ohm's Law (voltage=current*resistance) the voltage in the word line WL would be 1 Volt. Alternatively, for example, if there is 1 nanoampere (nA) of current in the word line WL, a 1 Giga Ohm (G$\Omega$) resistor may be used to saturate the word line voltage at 1 Volt. It should be understood that the specific resistances are given as examples and that in practice any value may be used and may be desirable depending on the amount of through current present in a particular word line.

Additionally, the particular resistor values used in a specific memory array may vary depending on the characteristics of particular cells within the array and on the characteristics of particular word lines in the array. For example, because the edge word lines WL(0) and WL(M) in a NAND string generally are more susceptible to through current than non-edge word lines, the resistances of the elements for the non-edge word lines may be different from the resistances of the elements for the edge word lines WL(0) and WL(M). The voltage difference between the edge word lines and the non-edge word lines may range from approximately 0.3 volts to approximately 2.0 volts, for example. Additionally, the current may increase anywhere from approximately 1.2 times to approximately 100 times.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claimed is:

1. A memory array comprising:
   a string comprising a plurality of transistors, wherein each of the plurality of transistors comprises:
   a charge storage node; and
   a control gate; and
   at least one resistive element coupled to the string, wherein the control gate of at least one of the plurality of transistors is configured to be selectively coupled to a reference potential via a corresponding one of the at least one resistive element during an erase operation.

2. The memory array, as set forth in claim 1, comprising a plurality of driver transistors, wherein each of the plurality of at least one is coupled to a corresponding one of the plurality of driver transistors.

3. The memory array, as set forth in claim 2, wherein the plurality of driver transistors are capable of operating in the 25 to 30 volt range.

4. The memory array, as set forth in claim 1, wherein the charge storage node comprises a floating gate and wherein each of the plurality of transistors further comprises a tunnel dielectric between the floating gate of the respective one of the transistors and a substrate.

5. The memory array, as set forth in claim 4, wherein the floating gate of each of the plurality of transistors comprises a polysilicon.

6. The memory array, as set forth in claim 1, wherein the control gate of each of the plurality of transistors comprises a polysilicon.

7. The memory array, as set forth in claim 1, wherein the one of the plurality of resistive elements has a resistive value between 0.1 Mega Ohm and 100 MOhm.

8. The memory array, as set forth in claim 1, wherein one of the plurality of resistive elements has a resistive value between 0.1 Giga Ohm and 100 Giga Ohm.

9. The memory array, as set forth in claim 1, wherein a respective resistance of the at least one resistive element is selected based upon an amount of current flow from a substrate to the control gate during an erase operation.

10. The memory array, as set forth in claim 1, wherein the at least one resistive element comprises a plurality of resistive elements and wherein a resistance of each of the plurality of resistive elements is at least partially based on a location of the respective transistor relative to a select gate.

11. The memory array, as set forth in claim 10, wherein a respective resistance at least one of the plurality of resistive elements coupled to at least one of the plurality of transistors adjacent the select gate is lower than a resistance of a resistive element coupled to at least one of the plurality of transistors that is not adjacent to the select gate.

12. A method of fabricating a memory array comprising:
    forming a charge storage node; and
    forming a control gate adjacent the charge storage node;
    wherein the control gate is configured to be selectively coupled to a reference potential via a resistive element during an erase operation.

13. The method of fabricating a memory array, as set forth in claim 12, wherein coupling the resistive element into the ground connected pass of the control gate layer comprises coupling a first resistive element having a first resistive value to a first control gate layer and coupling a second resistive element having a different resistive value to a second control gate layer.

14. The method of fabricating a memory array, as set forth in claim 13, wherein the first resistive element is coupled to a word line adjacent to a select gate of a NAND string.

15. The method of fabricating a memory array, as set forth in claim 14, wherein the second resistive element is coupled to a word line that is not adjacent to a select gate.

16. The method of fabricating a memory array, as set forth in claim 12 comprising forming a driver transistor.

17. A floating gate transistor comprising:
    a floating gate disposed over a channel, the floating gate being separated from the channel by a tunnel oxide layer; and
    a control gate disposed over the floating gate, the control gate being separated from the floating gate by an inter-gate dielectric layer, wherein the control gate is configured to be selectively coupled to a ground connected resistor during an erase operation.

18. The floating gate transistor of claim 17, wherein the control gate is coupled to a driver transistor.

19. The floating gate transistor of claim 17, wherein the inter-gate dielectric layer comprises oxide nitridized oxide.

20. A method of performing an erase operation in a NAND flash memory array comprising:
    applying a voltage to a substrate; and
    electrically coupling a plurality of resistors to a ground connected pass of a corresponding plurality of word lines.

21. The method of performing an erase operation of claim 20, wherein applying the voltage to a substrate comprises applying a voltage between 16 and 25 volts to the substrate.

22. The method of performing an erase operation of claim 20, wherein electrically coupling the plurality of resistors to the plurality of word lines comprises operating a driver transistor.

23. A method for operating a memory array comprising:
    saturating a through current during an erase operation of a floating gate memory array by electrically coupling a control gate to ground via a resistor.

24. The method of claim 23, wherein a driver transistor is actuated during the erase operation to electrically couple the control gate to ground via the resistor.

25. The method of claim 23, wherein the control gate is adjacent to a select gate in a NAND string of a NAND flash memory array.

26. A memory array comprising:
    a string comprising a plurality of transistors, wherein each of the plurality of transistors comprises:
    a charge storage node;
    a control gate; and at least one resistive element coupled to the string, wherein the control gate of at least one of the plurality of transistors is configured to be selectively coupled to a reference potential via a corresponding one of the at least one resistive element, wherein the at least one resistive element comprises a plurality of resistive elements and wherein a resistance of each of the plurality of resistive elements is at least partially based on a location of the respective transistor relative to a select gate.

27. The memory array, as set forth in claim 26, wherein a respective resistance at least one of the plurality of resistive elements coupled to at least one of the plurality of transistors adjacent the select gate is lower than a resistance of a resistive element coupled to at least one of the plurality of transistors that is not adjacent to the select gate.

* * * * *